(12) United States Patent
Chandra et al.

(10) Patent No.: US 10,915,485 B2
(45) Date of Patent: Feb. 9, 2021

(54) CIRCUIT FOR ASYNCHRONOUS DATA TRANSFER

(71) Applicant: NXP USA, INC., Austin, TX (US)

(72) Inventors: Deepika Chandra, Noida (IN); Ramesh M. Sangolli, Dharwad (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/414,793

(22) Filed: May 17, 2019

(65) Prior Publication Data
US 2020/0364174 A1    Nov. 19, 2020

(51) Int. Cl.
*G06F 13/42* (2006.01)
*H03K 3/037* (2006.01)

(52) U.S. Cl.
CPC ........... *G06F 13/42* (2013.01); *H03K 3/0372* (2013.01)

(58) Field of Classification Search
CPC ...................................................... G06F 13/42
See application file for complete search history.

(56) References Cited

U.S. PATENT DOCUMENTS

| 4,682,304 | A | 7/1987 | Tierney |
| 5,339,395 | A | 8/1994 | Pickett et al. |
| 9,882,711 | B1 * | 1/2018 | Jang .................... H04L 7/048 |
| 2007/0280396 | A1 | 12/2007 | Liu et al. |
| 2014/0143581 | A1 | 5/2014 | Garg et al. |
| 2014/0351359 | A1 * | 11/2014 | Grocutt .............. G06F 13/4282 709/209 |
| 2019/0213164 | A1 * | 7/2019 | Kwon ...................... G06F 1/08 |

FOREIGN PATENT DOCUMENTS

WO    WO-2008/000059 A1    1/2008

* cited by examiner

*Primary Examiner* — David E Martinez
(74) *Attorney, Agent, or Firm* — Charlene R. Jacobsen

(57) ABSTRACT

A circuit for asynchronous data transfer includes a slave device having an asynchronous slave clock for transferring data to a master device having a master clock. The slave clock is a non-continuous clock signal. The slave device includes a clock detection circuit, a register bank, a temporary storage register, and a datapath selector. The slave device receives a data transfer command from the master device. The clock detection circuit detects a presence of the slave clock signal and generates a sync signal. To transfer the data to the master device, the datapath selector selects one of the temporary storage register and the register bank based on the sync signal. The slave device ensures seamless data transfer to the master device regardless of the presence or absence of the slave clock signal.

18 Claims, 7 Drawing Sheets

CIRCUIT FOR ASYNCHRONOUS DATA TRANSFER

BACKGROUND

The present invention relates generally to data communication between electronic devices, and, more particularly, to transferring data from a slave device that has an intermittent, non-continuous clock to a master device.

Integrated circuits, such as system-on-chips (SoCs) and application specific integrated circuits (ASICs), usually include multiple clock domains that are asynchronous to each other. For example, a system that uses a master-slave protocol includes master devices that use asynchronous clock signals and slave devices that use slave clock signals. The master and slave clock signals, when asynchronous to each other, cause clock domain crossing (CDC) issues during data transfer between the master and slave devices. Such CDC issues can result in loss of data or transfer of erroneous data.

Various clock synchronization techniques have been used to resolve the incompatibilities between the master and slave clock signals to overcome CDC issues. However, such clock synchronization techniques may fail to overcome the CDC issues when the slave device uses a non-continuous slave clock signal. Furthermore, for communication protocols like serial peripheral interface (SPI) and inter-integrated circuit (I2C), it is critical for the master device to receive requested data from the slave device in a predetermined data transfer cycle. Thus, extending the data transfer cycle and waiting for the slave clock signal to be available as a synchronization technique is unsuitable.

One solution to overcome the above-mentioned problem includes the use of first-in-first-out (FIFO) buffers to transfer the data between the master and slave devices. However, the FIFO buffers increase the size and complexity of the slave device.

Accordingly, it would be advantageous to have a slave device that can seamlessly transfer requested data to a master device regardless of the availability of the slave clock signal.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
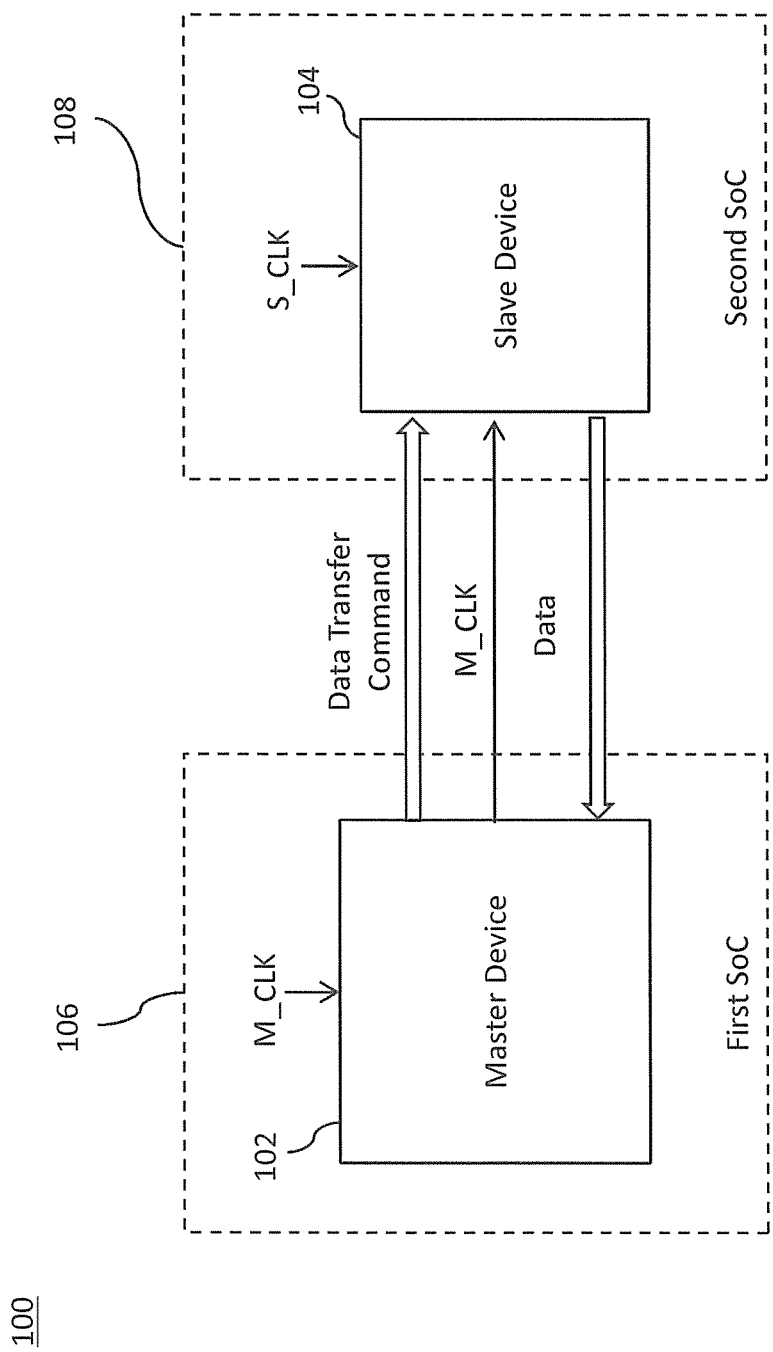
FIG. 1 is a schematic block diagram of master and slave devices that transfer data from the slave to the master in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The terms "master device" and "slave device" are used interchangeably with the terms "master" and "slave", respectively. The terms "high" and "low" refer to high and low logic states. The terms "comprises," "comprising," or variations thereof are intended to cover a non-exclusive inclusion, such that module, circuit, device components, structures and method steps that comprises a list of elements or steps does not include only those elements but may include other elements or steps not expressly listed or inherent to such module, circuit, device components or steps. Thus, an element or step proceeded by "comprises . . . a" does not, without more constraints, preclude the existence of additional identical elements or steps that comprises the element or step.

In one embodiment, the present invention provides a slave that operates using a non-continuous slave clock signal for transferring data to a master that operates using a master clock signal. The slave includes a clock detection circuit, a register bank, a temporary storage register, and a datapath selector. The clock detection circuit receives a data request signal for transferring the data to the master and generates a sync signal. The sync signal is inactive when the slave clock signal is absent and active when the slave clock signal is present and the data request signal is active. The register bank stores the data. The temporary storage register is connected to the clock detection circuit and receives the sync signal. The temporary storage register also is connected to the register bank for receiving the data therefrom. The temporary storage register receives the data when the sync signal is asserted. The datapath selector has data terminals connected to the register bank and the temporary storage register, and a control terminal connected to the clock detection circuit for receiving the sync signal. The datapath selector outputs data from of the temporary storage register and the register bank based on the sync signal, and the output data is sent to the master.

In another embodiment, the present invention provides a system-on-chip (SoC) that includes a slave device that transfers data to a master device. The master and slave devices operate based on master and slave clock signals, respectively, that are asynchronous to each other, and where the slave clock signal is a non-continuous clock signal. The slave device includes a clock detection circuit, a register bank, a temporary storage register, and a datapath selector. The clock detection circuit receives a data request signal for transferring the data to the master and generates a sync signal. The sync signal is inactive when the slave clock signal is absent and is active when the slave clock signal is present and the data request signal is active. The register bank stores the data. The temporary storage register is connected to the clock detection circuit for receiving the sync signal, and is connected to the register bank for receiving the data therefrom. The temporary storage register receives the data when the sync signal is asserted. The datapath selector has data input terminals respectively connected to the register bank and the temporary storage register, and a control terminal connected to the clock detection circuit for receiving the sync signal. The datapath selector outputs one of the temporary storage register and the register bank based on the sync signal, and the output data is provided to the master.

In yet another embodiment, the present invention provides a method for transferring data from a slave device operating based on a non-continuous slave clock signal to a master device operating based on a master clock signal that is asynchronous to the slave clock signal. The method includes receiving, by the slave from the master, a data transfer command for transferring the data to the master, and generating, by the slave, a data request signal based on the data transfer command. The method further includes detecting a presence of the slave clock signal, by the slave device, based on the data request signal and generating a sync signal, by the slave device, based on the detection of the slave clock signal. The sync signal is inactive state when the slave clock signal is absent and is asserted when the slave clock signal is present and the data request signal is active. The method further includes outputting, by the slave device, one of a temporary storage register and a register bank of the slave device based on the sync signal, to the master device.

Various embodiments of the present invention provide a slave device including a circuit for asynchronous data transfer so that the slave device with a non-continuous clock signal can transfer data to a master device. The master and slave devices operate based on respective master and slave clock signals that are asynchronous with respect to each other. The slave clock signal is a non-continuous clock signal. The slave device includes a clock detection circuit, a register bank, a temporary storage register, and a datapath selector. The register bank stores the data to be transferred to the master device. The clock detection circuit receives a data request signal for transferring the data to the master device and generates a sync signal. The data request signal is in synchronization with the master clock signal and the sync signal is synchronous with the slave clock signal. The sync signal is inactive when the slave clock signal is absent. The clock detection circuit asserts the sync signal when the slave clock signal is present and the data request signal is active. The temporary storage register receives the data from the register bank when the sync signal is asserted. The datapath selector receives the sync signal and then selects one of the temporary storage register and the register bank to transfer the data to the master device. The temporary storage register is selected when the slave clock signal is present and the register bank is selected when the slave clock signal is absent. Thus, the slave device provides seamless data transfer to the master device regardless of the presence or absence of the slave clock signal.

Referring now to FIG. 1, a schematic block diagram of a system including a master device 102 in communication with a slave device 104, in accordance with an embodiment of the present invention, is shown. The master device 102 is implemented on a first system-on-chip (SoC) 106 and operates based on a master clock signal M_CLK. The master clock signal M_CLK is generated by a first clock generator (not shown) associated with the first SoC 106. In one embodiment, the master device 102 may include the first clock generator, although in other embodiments, the first clock generator may be external to the master device 102.

The master device 102 is in communication with the slave device 104 and may receive data from and write data to the slave device 104. For example, the master 102 may read sensor data of multiple sensors (not shown) by way of the slave 104 and may write sensor configuration data to the slave 104 to configure the sensors. For receiving data from the slave 104, the master 102 generates and provides to the slave 104 a data transfer command, which includes at least a size of the data to be received and a memory address of the slave 104 from which the data is to be retrieved. The master 102 further provides the master clock signal M_CLK to the slave 104.

The slave device 104 is implemented on a second SoC 108 and operates based on a slave clock signal S_CLK generated by a second clock generator (not shown) associated with the second SoC 108. In one embodiment, the slave 104 may include the second clock generator, although in other embodiments, the second clock generator may be external to the slave device 104. The master and slave clock signals M_CLK and S_CLK are asynchronous with respect to each other. Further, the slave clock signal S_CLK is a non-continuous clock signal, i.e., the slave clock signal S_CLK may not always be available. For example, the second clock generator may enable (i.e., periodic assertion and de-assertion) the slave clock signal S_CLK during a first time period to update data stored by the slave 104 and disable (i.e., to be inactive) the slave clock signal S_CLK during a second time period. Thus, during the first time period, the slave clock signal S_CLK is present and during the second time period, the slave clock signal S_CLK is absent.

The slave 104 is connected to the master 102 for receiving the data transfer command and the master clock signal M_CLK, and based on the data transfer command, the slave 104 transmits the requested data to the master 102 regardless of the presence or absence of the slave clock signal S_CLK.

It will be apparent to those of skill in the art that even though the master and slave devices 102 and 104 are shown as implemented on the first and second SoCs 106 and 108, respectively, in other embodiments, the master and slave devices 102 and 104 may be implemented on a single SoC, such as the first SoC 106 or the second SoC 108.

Figure 2:
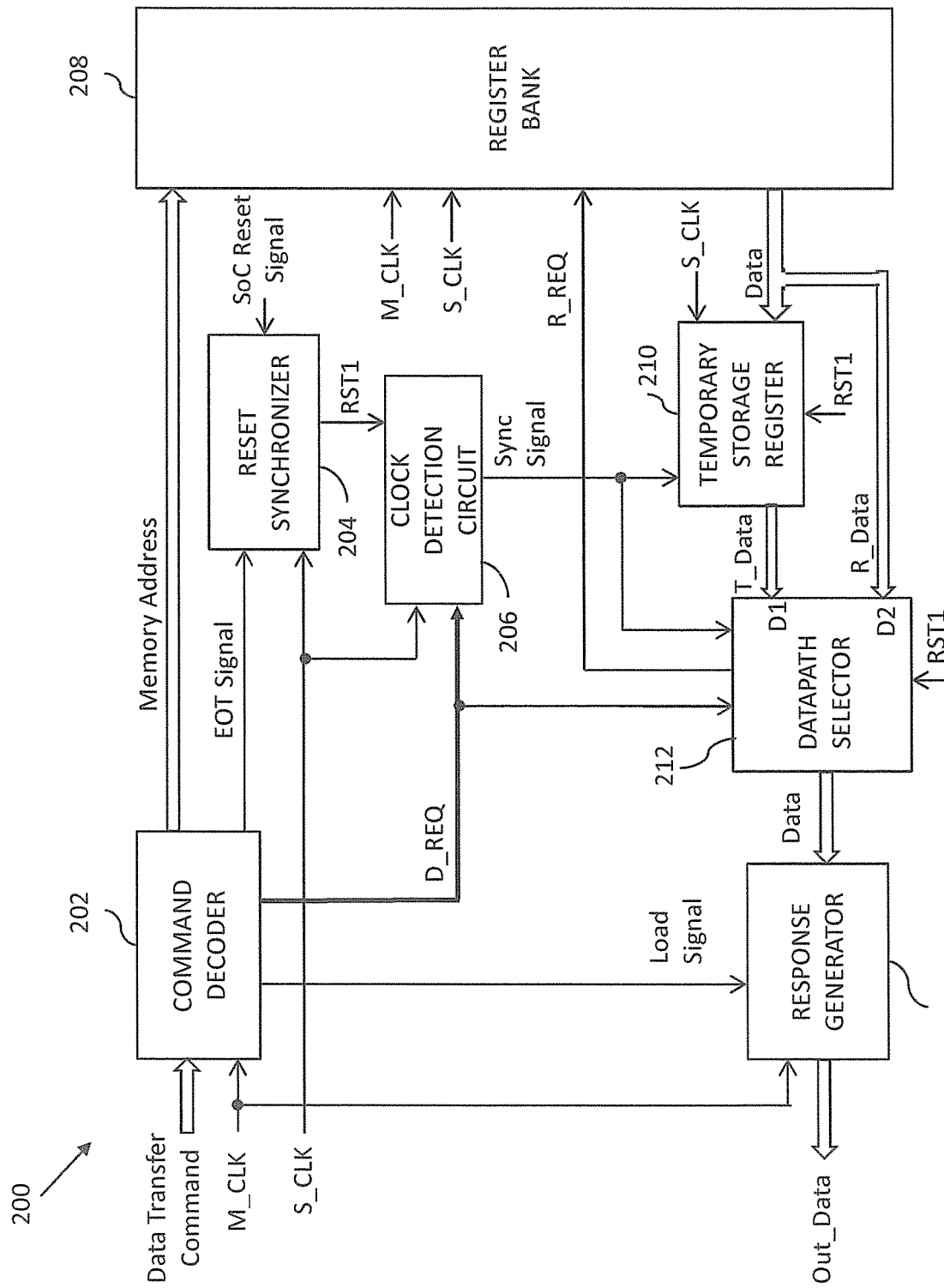
FIG. 2 is a schematic block diagram of a slave device in accordance with an embodiment of the present invention.

Referring now to FIG. 2, a schematic block diagram of a circuit 200 for transferring data from a slave device to a master device in accordance with an embodiment of the present invention is shown. The circuit 200 includes a command decoder 202, a reset synchronizer 204, a clock detection circuit 206, a register bank 208, a temporary storage register 210, a datapath selector 212, and a response generator 214.

The command decoder 202 is connected to the master 102 for receiving the data transfer command and the master clock signal M_CLK. The command decoder 202 includes a first buffer register (not shown) that operates based on the master clock signal M_CLK for temporarily storing the data transfer command. The command decoder 202 decodes the data transfer command to generate a data request signal D_REQ that is in sync with the master clock signal M_CLK. The data request signal D_REQ corresponds to a request to transfer the data to the master 102. Based on the data transfer command, the command decoder 202 further identifies the memory address and the size of the data requested by the master 102. The memory address indicates a physical address of a register (not shown) in the register bank 208 where the data to be transferred to the master 102 is stored. The command decoder 202 further generates a load signal and an end of transmission (EOT) signal. During transmission of the data, the EOT signal is inactive. In one embodiment, when the data has been successfully transmitted to the master 102, the command decoder 202 asserts the EOT signal (i.e., the EOT signal transitions from an inactive state to an active state) for a predetermined time duration. In one example, the predetermined time duration is equal to one clock cycle of the master clock signal M_CLK. After the predetermined time duration, the command decoder 202 de-asserts the EOT signal (i.e., the EOT signal transitions from the active state to the inactive state). In another embodiment, the command decoder 202 may assert the EOT signal for the predetermined time duration when the data to be transferred to the master 102 is loaded in the response generator 214.

The reset synchronizer 204 is connected to the command decoder 202 and receives the EOT signal. The reset synchronizer 204 also receives the slave clock signal S_CLK and an SoC reset signal. The reset synchronizer 204 generates a first reset signal RST1 based on the EOT signal and the SoC reset signal. When the EOT signal and the SoC reset signal are inactive, the first reset signal RST1 is inactive. When at least one of the EOT signal and the SoC reset signal is asserted, then the reset synchronizer 204 asserts the first reset signal RST1, which is used to reset the clock detection circuit 206 and the temporary storage register 210. When the EOT signal and the SoC reset signal are de-asserted, the reset synchronizer 204 de-asserts the first reset signal RST1 in synchronization with the slave clock signal S_CLK. The reset synchronizer 204 further provides the first reset signal RST1 to the datapath selector 212.

The clock detection circuit 206 is connected to the command decoder 202 and the reset synchronizer 204 and receives the data request signal D_REQ and the first reset signal RST1, respectively. The clock detection circuit 206 further receives the slave clock signal S_CLK. On receiving the data request signal D_REQ, the clock detection circuit 206 detects a presence of the slave clock signal S_CLK and generates a sync signal that is synchronous with the slave clock signal S_CLK. The sync signal is inactive when the slave clock signal S_CLK is absent. The clock detection circuit 206 asserts the sync signal for a predetermined time duration (for example, one cycle of the slave clock signal S_CLK) when the slave clock signal S_CLK is present and the data request signal D_REQ is active. In other words, the sync signal is inactive when the slave clock signal S_CLK is unavailable, and is asserted when the slave clock signal S_CLK is available and the data request signal D_REQ is active. The clock detection circuit 206 de-asserts the sync signal at the end of the predetermined time duration (i.e., one clock cycle of the slave clock signal S_CLK). The clock detection circuit 206 is reset when the first reset signal RST1 is asserted.

The register bank 208 is a memory that in one embodiment includes first and second sets of registers (not shown) for storing data, where each register may be accessed using a unique memory address. When the register bank 208 receives the slave clock signal S_CLK, data in the first set of registers is updated, and when the register bank 208 receives the master clock signal M_CLK, the second set of registers is updated with configuration data. The register bank 208 receives the memory address from the command decoder 202.

The temporary storage register 210 is an n-bit register (for example, n=16) and receives the slave clock signal S_CLK, the sync signal from the clock detection circuit 206, and the data requested by the master 102 from the temporary storage register 210. The temporary storage register 210 also receives the first reset signal RST1 from the reset synchronizer 204. The temporary storage register 210 receives the data from the register bank 208 when the sync signal is asserted. When the first reset signal RST1 is asserted, the temporary storage register 210 is reset. In the presently preferred embodiment, the temporary storage register 210 receives the data from the register bank 208 at the falling edge of the slave clock signal S_CLK when the sync signal is asserted.

The datapath selector 212 is connected to the command decoder 202 and the reset synchronizer 204 for receiving the data request signal D_REQ and the first reset signal RST1, respectively. The datapath selector 212 has first and second data input terminals respectively connected to the register bank 208 and the temporary storage register 210, and a control terminal connected to the clock detection circuit 206 for receiving the sync signal. Based on the data request signal D_REQ and the sync signal, the datapath selector 212 generates a register request signal R_REQ that is used to access the data stored in the register bank 208. The datapath selector 212 provides the register request signal R_REQ to the register bank 208 and based on the register request signal R_REQ, the datapath selector 212 receives the data stored at the memory address in the register bank 208.

Based on the register request signal R_REQ and the sync signal, the datapath selector 212 outputs one of the data stored in the register bank 208 and the temporary storage register 210. When the register request signal R_REQ or the sync signal is active (i.e., when the data transfer command is received and the slave clock signal S_CLK is present), then the datapath selector 212 outputs the data stored in the temporary storage register 210 and when the register request signal R_REQ and the sync signal are de-asserted (i.e., when the data transfer command is received and the slave clock signal S_CLK is absent), the datapath selector 212 outputs the data stored in the register bank 208.

The response generator 214 is connected to the master 102, the command decoder 202, and the datapath selector 212 for receiving the master clock signal M_CLK, the load signal, and the data, respectively. The response generator 214 includes a second buffer register (not shown) for temporarily storing the data to be transmitted to the master 102. The second buffer register operates based on the master clock signal M_CLK. The second buffer register is loaded with the data when the load signal is active. The response generator 214 transmits the data received from the datapath selector 212 to the master device 102.

Figure 3:
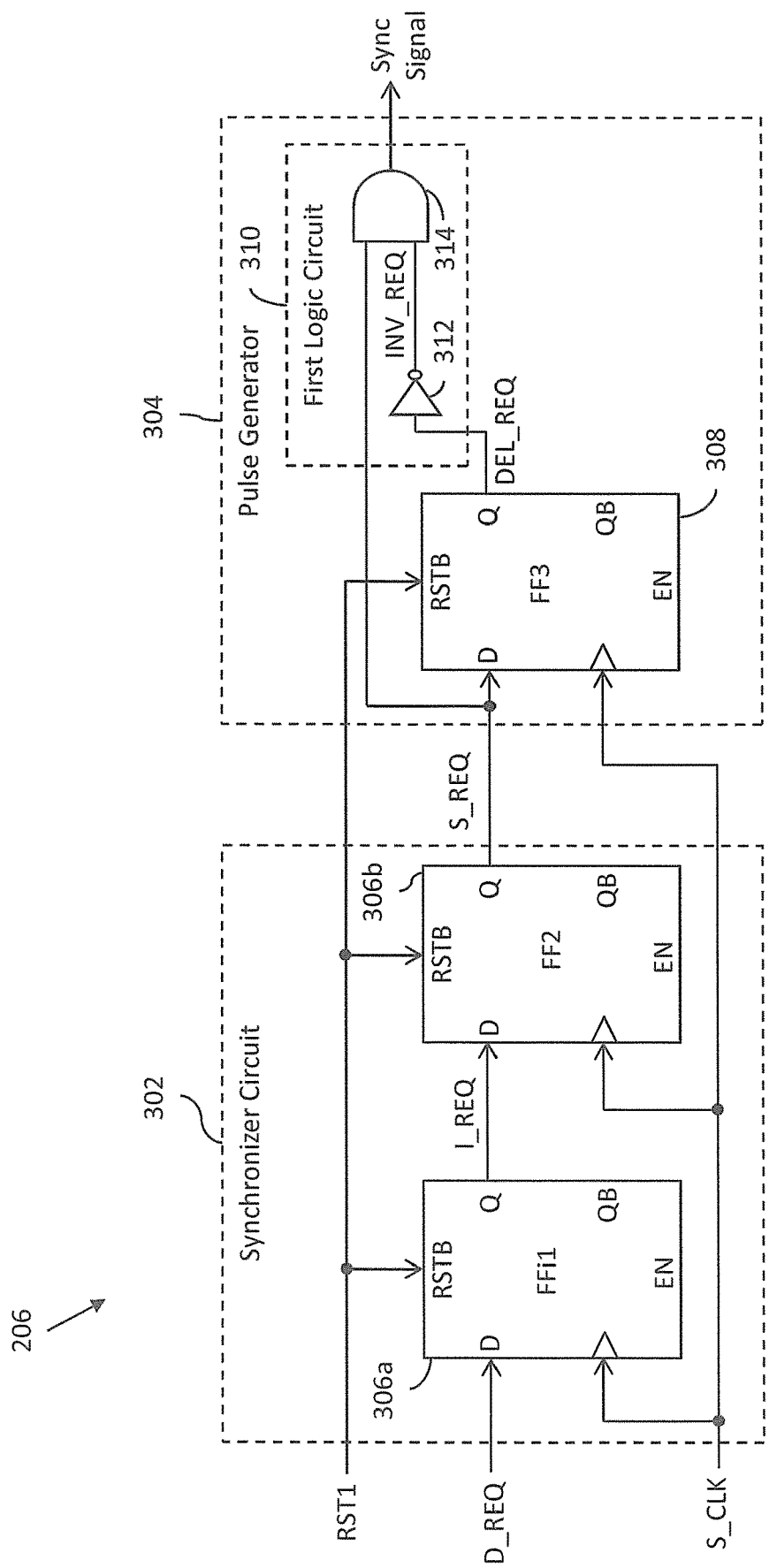
FIG. 3 is a schematic block diagram of a clock detection circuit of the slave device of FIG. 2 in accordance with an embodiment of the present invention.

Referring now to FIG. 3, a schematic block diagram of the clock detection circuit 206 in accordance with an embodiment of the present invention is shown. The clock detection circuit 206 includes a synchronizer circuit 302 and a pulse generator 304.

The synchronizer circuit 302 is connected to the command decoder 202 and the reset synchronizer 204 for receiving the data request signal D_REQ and the first reset signal RST1, respectively. The synchronizer circuit 302 also receives the slave clock signal S_CLK. Based on the data request signal D_REQ and the slave clock signal S_CLK, the synchronizer circuit 302 generates a synchronized request signal S_REQ. When the slave clock signal S_CLK is present, the synchronizer circuit 302 synchronizes the data request signal D_REQ with the slave clock signal S_CLK and asserts the synchronized request signal S_REQ. When the slave clock signal S_CLK is absent, the synchronized request signal S_REQ is inactive. The synchronizer circuit 302 includes first and second flip-flops 306a and 306b.

The first flip-flop 306a has a data input terminal and a reset terminal respectively connected to the command decoder 202 and the reset synchronizer 204 for receiving the data request signal D_REQ and the first reset signal RST1. The first flip-flop 306a further has a clock terminal for receiving the slave clock signal S_CLK, and an output terminal for providing an intermediate request signal I_REQ. When the slave clock signal S_CLK is present and the data request signal D_REQ is active, the first flip-flop 306a asserts the intermediate request signal I_REQ. When the slave clock signal S_CLK is absent, the intermediate request signal I_REQ is inactive. When the first reset signal RST1 is asserted, the first flip-flop 306a is reset.

The second flip-flop 306b has a data input terminal and a reset terminal respectively connected to the output terminal of the first flip-flop 306a and the reset synchronizer 204 for receiving the intermediate request signal I_REQ and the first reset signal RST1. The second flip-flop 306b further has a clock terminal for receiving the slave clock signal S_CLK, and an output terminal for generating the synchronized request signal S_REQ. When the slave clock signal S_CLK is present and the intermediate request signal I_REQ is active, the second flip-flop 306b asserts the synchronized request signal S_REQ, and when the slave clock signal S_CLK is absent, the synchronized request signal S_REQ is inactive. When the first reset signal RST1 is asserted, the second flip-flop 306b is reset. It will be apparent to those of skill in the art that the scope of the synchronizer circuit 302 is not limited to two flip-flops, but may include any number of flip-flops without deviating from the scope of the invention.

The pulse generator 304 is connected to the synchronizer circuit 302 and the reset synchronizer 204 for receiving the synchronized request signal S_REQ and the first reset signal RST1, respectively. The pulse generator 304 also receives the slave clock signal S_CLK. Based on the synchronized request signal S_REQ and the slave clock signal S_CLK, the pulse generator 304 generates the sync signal. When the slave clock signal S_CLK is present and the data request signal D_REQ is active, then the pulse generator 304 asserts the sync signal for the predetermined time duration, and when the slave clock signal S_CLK is absent, the sync signal is inactive. The pulse generator 304 includes a third flip-flop 308 and a first logic circuit 310.

The third flip-flop 308 has a data input terminal connected to the output terminal of the second flip-flop 306b for receiving the synchronized request signal S_REQ, and a clock terminal for receiving the slave clock signal S_CLK. The third flip-flop 308 also has a reset terminal connected to the reset synchronizer 204 for receiving the first reset signal RST1, and an output terminal for providing a delayed request signal DEL_REQ. When the first reset signal RST1 is asserted, the third flip-flop 308 is reset.

The first logic circuit 310 is connected to the output terminals of the second and third flip-flops 306b and 308 for receiving the synchronized request signal S_REQ and the delayed request signal DEL_REQ, respectively. Based on the synchronized request signal S_REQ and the delayed request signal DEL_REQ, the first logic circuit 310 generates the sync signal. In one embodiment, the first logic circuit 310 includes first and second logic gates 312 and 314, which are an inverter and an AND gate.

The first logic gate 312 has an input terminal connected to the output terminal of the third flip-flop 308 for receiving the delayed request signal DEL_REQ and provides an inverted version INV_REQ of the delayed request signal DEL_REQ at its output. The second logic gate 314 receives the synchronized request signal S_REQ and the INV_REQ signal and generates the sync signal.

It will be apparent to those of skill in the art that the scope of the first logic circuit 310 is not limited to the first and second logic gates 312 and 314, but may be implemented using a different combination of logic gates to achieve the same functionality.

Figure 4:
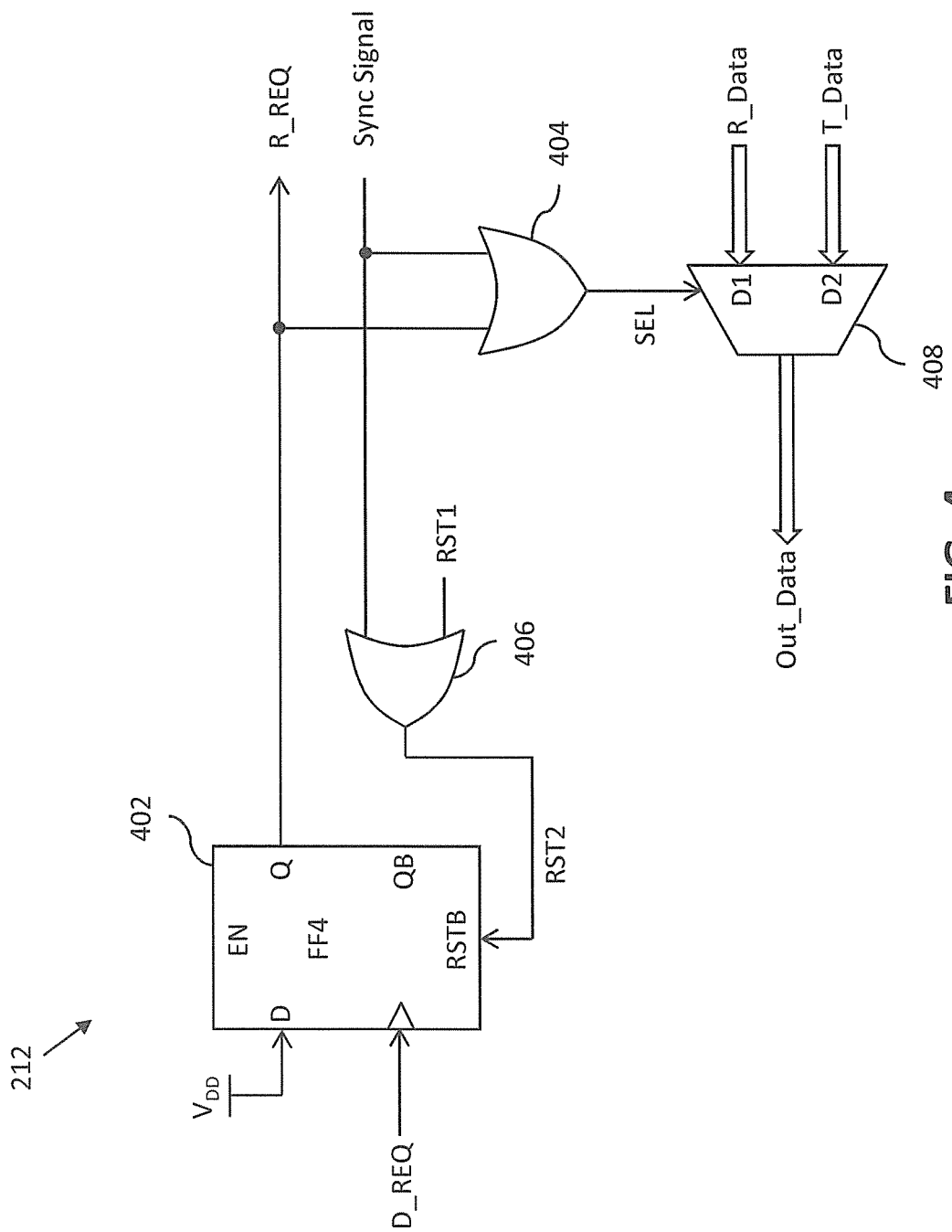
FIG. 4 is a schematic block diagram of a datapath selector of the slave device of FIG. 2 in accordance with an embodiment of the present invention.

Referring now to FIG. 4, a schematic block diagram of the datapath selector 212 in accordance with an embodiment of the present invention is shown. The datapath selector 212 includes a fourth flip-flop 402, second and third logic circuits 40 and 406, and a multiplexer or mux 408.

The fourth flip-flop 402 has a data input terminal for receiving an input signal $V_{DD}$, and a clock terminal connected to the command decoder 202 for receiving the data request signal D_REQ. The input signal $V_{DD}$ is a logic high signal (i.e., set at 1). The fourth flip-flop 402 also has a reset terminal connected to the third logic circuit 406, and an output terminal that provides the register request signal R_REQ, which is provided to the register bank 208. Since the fourth flip-flop 402 is clocked by the data request signal D_REQ and the input terminal of the fourth flip-flop 402 receives the logic high signal $V_{DD}$, the output of the fourth flip-flop 402, i.e., the register request signal R_REQ, is asserted when the data request signal D_REQ is asserted. If the sync signal is inactive (i.e., if the slave clock signal S_CLK is absent), the register request signal R_REQ remains asserted during the data transmission. However, if the sync signal is asserted (i.e., if the slave clock signal S_CLK is present), the register request signal R_REQ is de-asserted by the third logic circuit 406 by way of the reset terminal of the fourth flip-flop 402.

The second logic circuit 404, which may be a two-input OR gate, receives the R_REQ signal from the fourth flip-flop 402 and the sync signal from the second logic gate 314 and generates a select signal SEL that is input to the mux408 to select one of the data from the register bank 208 or the temporary storage register 210 to output to the master 102. The select signal SEL is active when at least one of the sync signal and the register request signal R_REQ is active and is inactive when the sync signal and the register request signal R_REQ both are inactive. In other words, the select signal is asserted when the data transfer command is received, i.e., when the data request signal D_REQ is asserted. The select signal remains asserted if the slave clock signal S_CLK is absent and is de-asserted if the slave clock signal S_CLK is present.

The third logic circuit 406 also may be a two-input OR gate that receives the sync signal the first reset signal RST1 and generates a second reset signal RST2, which is input to the reset terminal of the fourth flip-flop 402. When the sync signal and the first reset signal RST1 are de-asserted, the second reset signal RST2 also is de-asserted and when at least one of the sync signal and the first reset signal RST1 is asserted, the second reset signal RST2 is asserted.

It will be apparent to those of skill in the art that the second and third logic circuits 404 and 406 are not limited to OR gates, but may be implemented using different combinations of logic gates to achieve the same functionality.

As noted above, the mux 408 has first and second data input terminals respectively connected to the temporary storage register 210 and the register bank 208 and a select terminal connected to the second logic circuit 404 for receiving the select signal SEL. The mux 408 outputs the data from one of the temporary storage register 210 and the register bank 208 depending on the value of the select signal SEL. When the data transfer command is received and the slave clock signal S_CLK is present, the mux 408 selects the temporary storage register 210 and when the select signal SEL is inactive, the mux 408 selects the register bank 208 for outputting the data.

Figure 5:
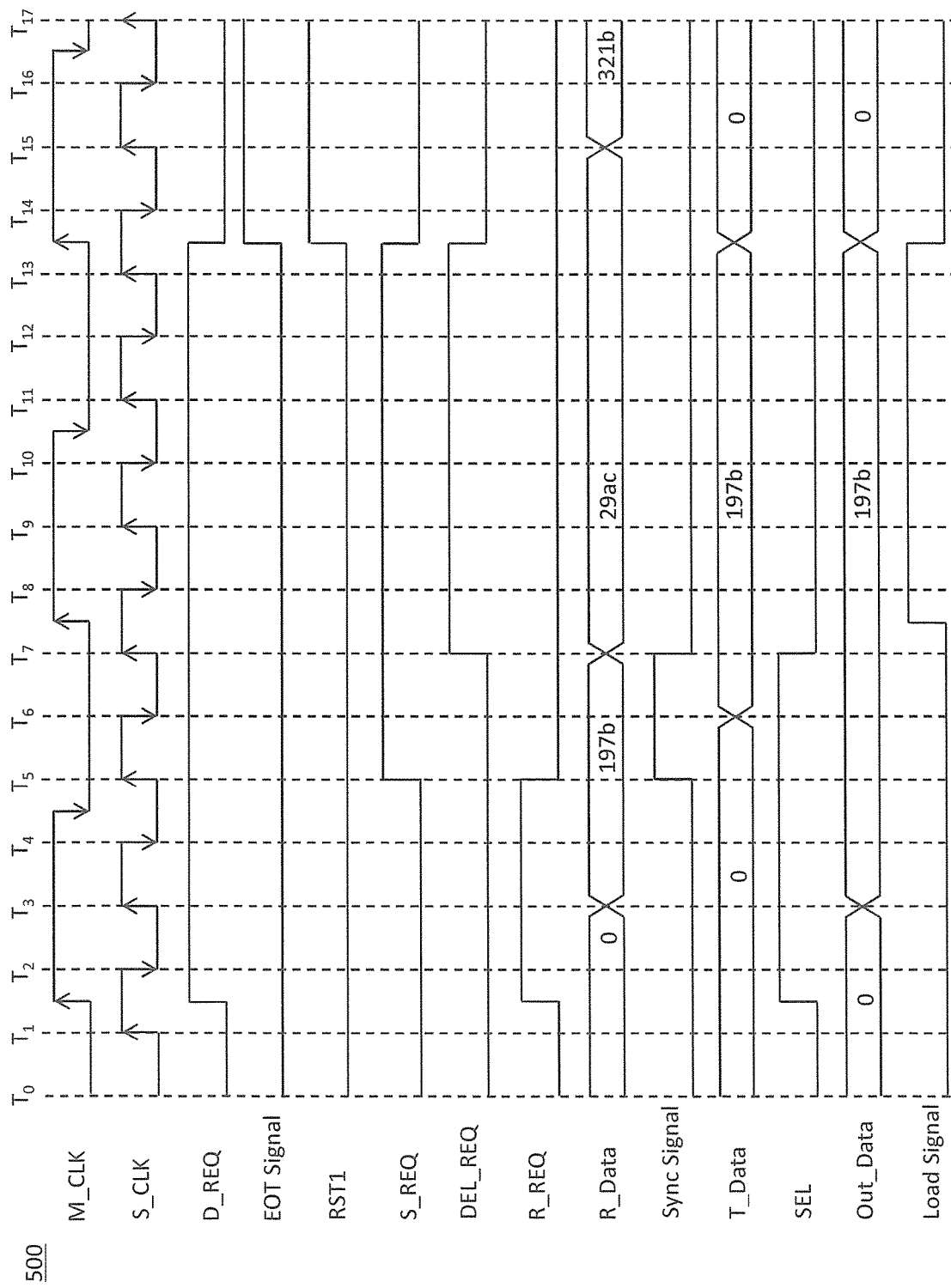
FIG. 5 is a timing diagram that illustrates a first data transfer operation in the presence of a slave clock signal of the slave device of FIG. 2 in accordance with an embodiment of the present invention.

Referring now to FIG. 5, a timing diagram 500 illustrating a first data transfer operation in the presence of the slave clock signal S_CLK is shown. For the sake of ongoing description, it is assumed that the slave clock signal S_CLK is enabled from $T_0$-$T_{17}$. In other words, the slave clock signal S_CLK is present and periodically asserted and de-asserted from $T_0$-$T_{17}$. The data stored in the temporary storage register 210 is hereinafter referred to as "T_Data" and the data stored in a first register (not shown) of the register bank 208 is hereinafter referred to as "R_Data". The data provided by the mux 408 to the response generator 214 is hereinafter referred to as "Out Data".

Before time $T_0$, the master 102 transmits the data transfer command to the slave 104.

From time $T_0$-$T_1$, the data request signal D_REQ, the first reset signal RST1, the synchronized request signal S_REQ, and the delayed request signal DEL_REQ are low (i.e., inactive). Further, the EOT signal, the register request signal R_REQ, the sync signal, the select signal SEL, and the load signal LD also are low.

From time $T_1$-$T_2$, the command decoder 202 receives and decodes the data transfer command and asserts the data request signal D_REQ at a rising edge of the master clock signal M_CLK. In turn, the fourth flip-flop 402 receives the data request signal D_REQ and asserts the register request signal R_REQ. The second logic circuit 404 receives the register request signal R_REQ and asserts the select signal SEL. Thus, from time $T_1$-$T_2$, the data request signal D_REQ, the register request signal R_REQ, and the select signal SEL transition from low to high (i.e., inactive to active). The EOT signal, the first reset signal RST1, the synchronized request signal S_REQ, the delayed request signal DEL_REQ, the sync signal, and the load signal LD remain low.

From time $T_2$-$T_3$, the data request signal D_REQ, the register request signal R_REQ, and the select signal SEL remain high (i.e., active), and the EOT signal, the first reset signal RST1, the synchronized request signal S_REQ, the delayed request signal DEL_REQ, the sync signal, and the load signal LD remain low.

At time $T_3$, the data request signal D_REQ, the register request signal R_REQ, and the select signal SEL remain high. The EOT signal, the first reset signal RST1, the synchronized request signal S_REQ, the delayed request signal DEL_REQ, the sync signal, and the load signal LD remain low. The first register of the register bank 208 is updated with data, e.g., '197b', at the rising edge of the slave clock signal S_CLK. Thus, the R_Data and the Out Data have a data value '197b'. The first flip-flop 306a receives the data request signal D_REQ and asserts the intermediate request signal I_REQ at the rising edge of the slave clock signal S_CLK that is observed at time $T_3$.

From time $T_3$-$T_5$, the data request signal D_REQ, the register request signal R_REQ, and the select signal SEL remain high. The EOT signal, the first reset signal RST1, the synchronized request signal S_REQ, the delayed request signal DEL_REQ, the sync signal, and the load signal LD remain low.

At time $T_5$, the second flip-flop 306b receives the intermediate request signal I_REQ and asserts the synchronized request signal S_REQ. Thus, the synchronized request signal S_REQ transitions from low to high. As the first logic gate 312 receives the delayed request signal DEL_REQ at logic low state, the first logic gate 312 asserts the inverted request signal INV_REQ, so the second logic gate 314 receives the synchronized request signal S_REQ and the inverted request signal INV_REQ and asserts the sync signal. Thus, the sync signal transitions from low to high. The third logic circuit 406 receives the sync signal at logic high state and the first reset signal RST1 at logic low state, so asserts the second reset signal RST2. The fourth flip-flop 402 receives the second reset signal RST2 and thus de-asserts the register request signal R_REQ. Thus, the register request signal R_REQ transitions from high to low. The data request signal D_REQ and the select signal SEL remain high. The EOT signal, the first reset signal RST1, the delayed request signal DEL_REQ, and the load signal LD remain low.

From time $T_5$-$T_6$, the data request signal D_REQ, the synchronized request signal S_REQ, the sync signal, and the select signal SEL are high and the EOT signal, the first reset signal RST1, the delayed request signal DEL_REQ, the register request signal R_REQ, and the load signal LD are low.

At time $T_6$, the data request signal D_REQ, the synchronized request signal S_REQ, the sync signal, and the select signal SEL are high, and the EOT signal, the first reset signal RST1, the delayed request signal DEL_REQ, the register request signal R_REQ, and the load signal LD are low. The temporary storage register 210 receives the sync signal at logic high state and is loaded with the data, e.g., '197b', so T_Data is '197b'.

From time $T_6$-$T_7$, the data request signal D_REQ, the synchronized request signal S_REQ, the sync signal, and the select signal SEL remain high, while the EOT signal, the first reset signal RST1, the delayed request signal DEL_REQ, the register request signal R_REQ, and the load signal LD remain low.

At time $T_7$, the third flip-flop 308 receives the synchronized request signal S_REQ at logic high and asserts the delayed request signal DEL_REQ. Thus, the delayed request signal DEL_REQ transitions from low to high. The first logic gate 312 receives the delayed request signal DEL_REQ at logic high and thus de-asserts the inverted request signal INV_REQ. The second logic gate 314 receives the delayed request signal DEL_REQ at logic high and the inverted request signal INV_REQ at logic low, and de-asserts the sync signal. Thus, the sync signal transitions from high to low. Further, the second logic circuit 404 receives the sync signal and the register request signal R_REQ at logic low, and de-asserts the select signal SEL. Thus, the select signal SEL transitions from high to low, so the mux 408 outputs the data from the temporary storage register 210. The data request signal D_REQ and the synchronized request signal S_REQ remain high. The EOT signal, the first reset signal RST1, the register request signal R_REQ, and the load signal LD remain low. The first register of the register bank 208 is updated with the data, e.g., '29ac', so the R_Data is '29ac'.

From time $T_7$-$T_8$, the load signal LD transitions from low to high at the rising edge of the master clock signal M_CLK. The response generator 214 receives the load signal LD at logic high. Thus, the second buffer register is loaded with the data received from the multiplexer circuit 408. From time $T_7$-$T_8$ when the load signal LD transitions from low to high, the mux 408 selects the data from the temporary storage register 210 and the second buffer register is loaded with T_Data, e.g., '197b'. In other words, when the load signal LD transitions from low to high, the Out Data is the same as the T_Data. The response generator 214 sends the loaded data '197b' to the master device 102 based on the master clock signal M_CLK. The data request signal D_REQ, the delayed request signal DEL_REQ, and the synchronized request signal S_REQ remain high. The EOT signal, the first reset signal RST1, the register request signal R_REQ, the sync signal, and the select signal SEL remain low.

From time $T_8$-$T_{13}$, the data request signal D_REQ, the delayed request signal DEL_REQ, the synchronized request signal S_REQ, and the load signal LD remain high, while the EOT signal, the first reset signal RST1, the register request signal R_REQ, the sync signal, and the select signal SEL remain low.

The load signal LD remains high for a predetermined time period, for example one clock cycle of the master clock signal M_CLK. The load signal LD then transitions from high to low and the command decoder 202 asserts the EOT signal. Thus, from time $T_{13}$-$T_{14}$, the EOT signal transitions from low to high and the data request signal D_REQ transitions from high to low at the rising edge of the master clock signal M_CLK. The reset synchronizer 204 receives the EOT signal at logic high state, and thus asserts the first reset signal RST1 to reset the flip-flops 306a, 306b, and 308, and the temporary storage register 210. Thus, the first reset signal RST1 transitions from low to high. The synchronized request signal S_REQ and the delayed request signal DEL_REQ transition from high to low due to the reset of the first through third flip-flops 306a, 306b, and 308. Further, the third logic circuit 406 receives the first reset signal RST1 at logic high state, and thus, asserts the second reset signal RST2 to reset the fourth flip-flop 402. The register request signal R_REQ, the sync signal, and the select signal SEL remain low. T_Data is updated with data value '0' due to the reset of the temporary storage register 210. Thus, Out Data also is updated with data value '0'.

From time $T_{14}$-$T_{15}$, the EOT signal and the first reset signal RST1 remain high. The data request signal D_REQ, the synchronized request signal S_REQ, the delayed request signal DEL_REQ, the register request signal R_REQ, the sync signal, the select signal SEL, and the load signal LD remain low.

At time $T_{15}$, the EOT signal and the first reset signal RST1 remain high. The data request signal D_REQ, the synchronized request signal S_REQ, the delayed request signal DEL_REQ, the register request signal R_REQ, the sync signal, the select signal SEL, and the load signal LD remain low. The first register of the register bank 208 is updated with data, e.g., '321b' so the R_Data is '321b'.

From time $T_{15}$-$T_{17}$, the EOT signal and the first reset signal RST1 remain high, while the data request signal D_REQ, the synchronized request signal S_REQ, the delayed request signal DEL_REQ, the register request signal R_REQ, the sync signal, the select signal SEL, and the load signal LD remain low. The EOT signal is de-asserted at the next rising edge of the master clock signal M_CLK. After the EOT signal is de-asserted, the reset synchronizer 204 de-asserts the first reset signal RST1 in sync with the slave clock signal S_CLK. The slave device 104 then waits to receive a next data transfer command from the master device 102.

Figure 6:
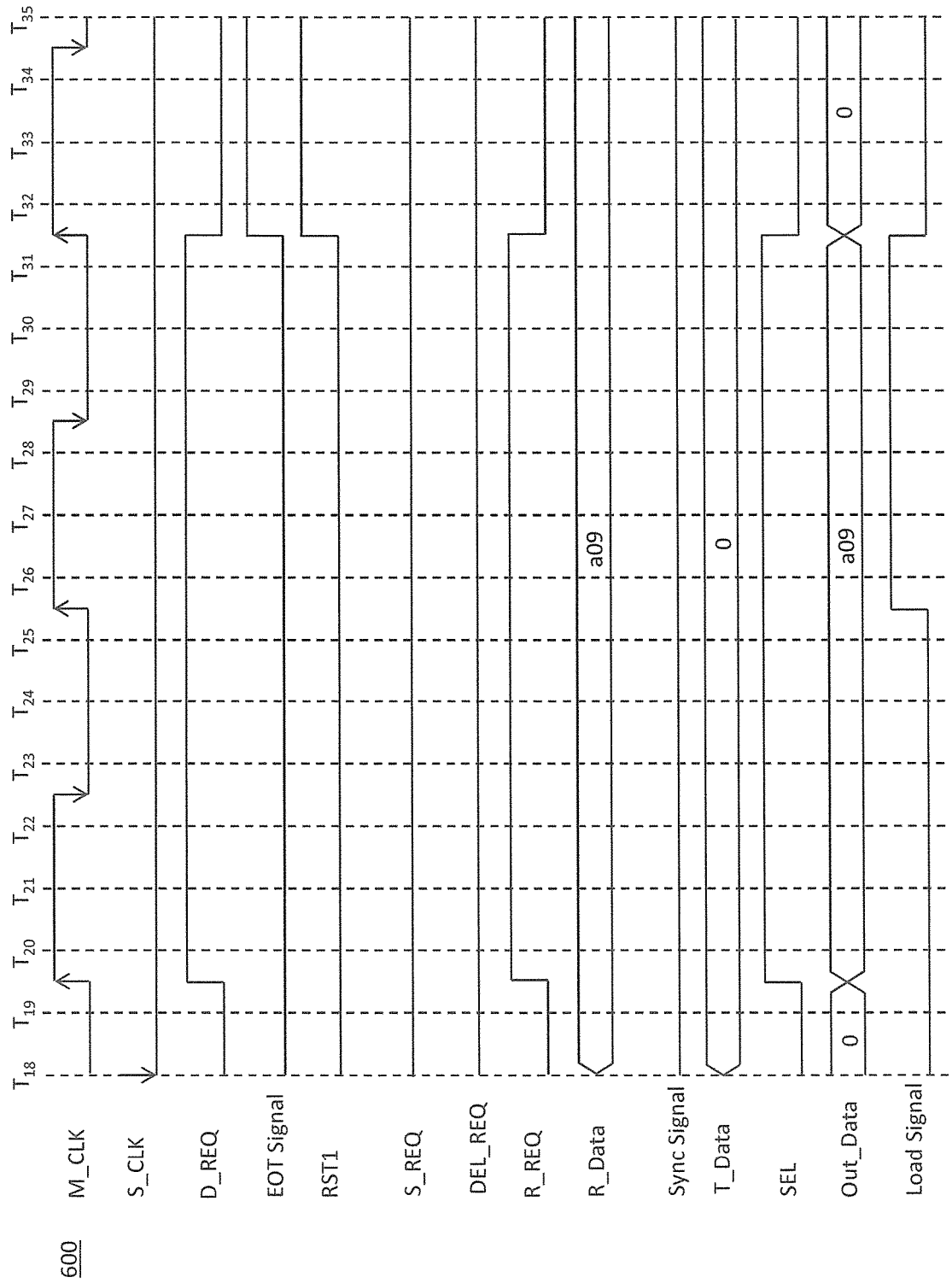
FIG. 6 is a timing diagram that illustrates a second data transfer operation in the absence of the slave clock signal of the slave device of FIG. 2 in accordance with an embodiment of the present invention.

Referring now to FIG. 6, a timing diagram 600 illustrating a second data transfer operation in the absence of the slave clock signal S_CLK is shown. That is, the slave clock signal S_CLK is disabled or absent from time $T_{18}$-$T_{35}$. The master device 102 transmits a new data transfer command to the slave device 104 for receiving data from the first register of the slave device 104.

From time $T_{18}$-$T_{19}$, the data request signal D_REQ, the first reset signal RST1, the synchronized request signal S_REQ, and the delayed request signal DEL_REQ are low. The EOT signal, the register request signal R_REQ, the sync signal, the select signal SEL, and the load signal LD also are low. The first register of the register bank 208 stores the data, e.g., 'a09', so R_Data is 'a09'.

From time $T_{19}$-$T_{20}$, the command decoder 202 receives and decodes the data transfer command and asserts the data request signal D_REQ at the rising edge of the master clock signal M_CLK, so the data request signal D_REQ goes from low to high. The fourth flip-flop 402 receives the data request signal D_REQ, so the fourth flip-flop 402 generates the register request signal R_REQ. Thus, the register request signal R_REQ transitions from low to high. The second logic circuit 404 receives the register request signal R_REQ and asserts the select signal SEL, so the mux 408 selects the register bank 208 data (R_data) for transferring to the master device 102. The EOT signal, the first reset signal RST1, the synchronized request signal S_REQ, the delayed request signal DEL_REQ, the sync signal, and the load signal LD remain low.

From time $T_{20}$-$T_{25}$, the data request signal D_REQ, the register request signal R_REQ, and the select signal SEL remain high. The EOT signal, the first reset signal RST1, the synchronized request signal S_REQ, the delayed request signal DEL_REQ, the sync signal, and the load signal LD remain low.

From time $T_{25}$-$T_{26}$, the load signal LD transitions from low to high at the rising edge of the master clock signal M_CLK. The response generator 214 receives the load signal LD, so the second buffer register is loaded with the Out Data (i.e., 'a09') received from the mux 408. From time $T_{25}$-$T_{26}$, when the load signal LD transitions from low to high, the mux 408 selects the data from the register bank 208 (R_data) for data transfer to the master device 102 and the second buffer register is loaded with Out Data, i.e., 'a09'. The response generator 214 initiates transmission of the data 'a09' to the master device 102 based on the master clock signal M_CLK. The data request signal D_REQ, the register request signal R_REQ, and the select signal SEL remain high. The EOT signal, the first reset signal RST1, the synchronized request signal S_REQ, the delayed request signal DEL_REQ, the sync signal, and the load signal LD remain low.

From time $T_{26}$-$T_{31}$, the data request signal D_REQ, the register request signal R_REQ, the select signal SEL, and the load signal LD remain high. The EOT signal, the first reset signal RST1, the synchronized request signal S_REQ, the delayed request signal DEL_REQ, and the sync signal remain low.

The load signal LD remains high for a predetermined time period, for example one clock cycle of the master clock signal M_CLK. The load signal LD then transitions from high to low and the command decoder 202 asserts the EOT signal. Thus, from time $T_{31}$-$T_{32}$, the reset synchronizer 204 receives the EOT signal and asserts the first reset signal RST1, which resets the first, second and third flip-flops 306a, 306b, and 308 and the temporary storage register 210. The data request signal D_REQ goes from high to low at the rising edge of the master clock signal M_CLK. Since the first through third flip-flops 306a, 306b, and 308 are reset, the register request signal R_REQ and the select signal SEL transition from high to low. Next, the third logic circuit 406 receives the first reset signal RST1 and asserts the second reset signal RST2, which resets the fourth flip-flop 402, so the register request signal R_REQ goes from high to low. The synchronized request signal S_REQ, the delayed request signal DEL_REQ, and the sync signal remain low.

From time $T_{32}$-$T_{35}$, the EOT signal and the first reset signal RST1 remain high. The data request signal D_REQ, the synchronized request signal S_REQ, the delayed request signal DEL_REQ, the register request signal R_REQ, the sync signal, the select signal SEL, and the load signal LD remain low. The EOT signal is de-asserted at the next rising edge of the master clock signal M_CLK. After the EOT signal is de-asserted, the reset synchronizer 204 de-asserts the first reset signal RST1. The slave device 104 then waits to receive a next data transfer command from the master device 102.

Figure 7:
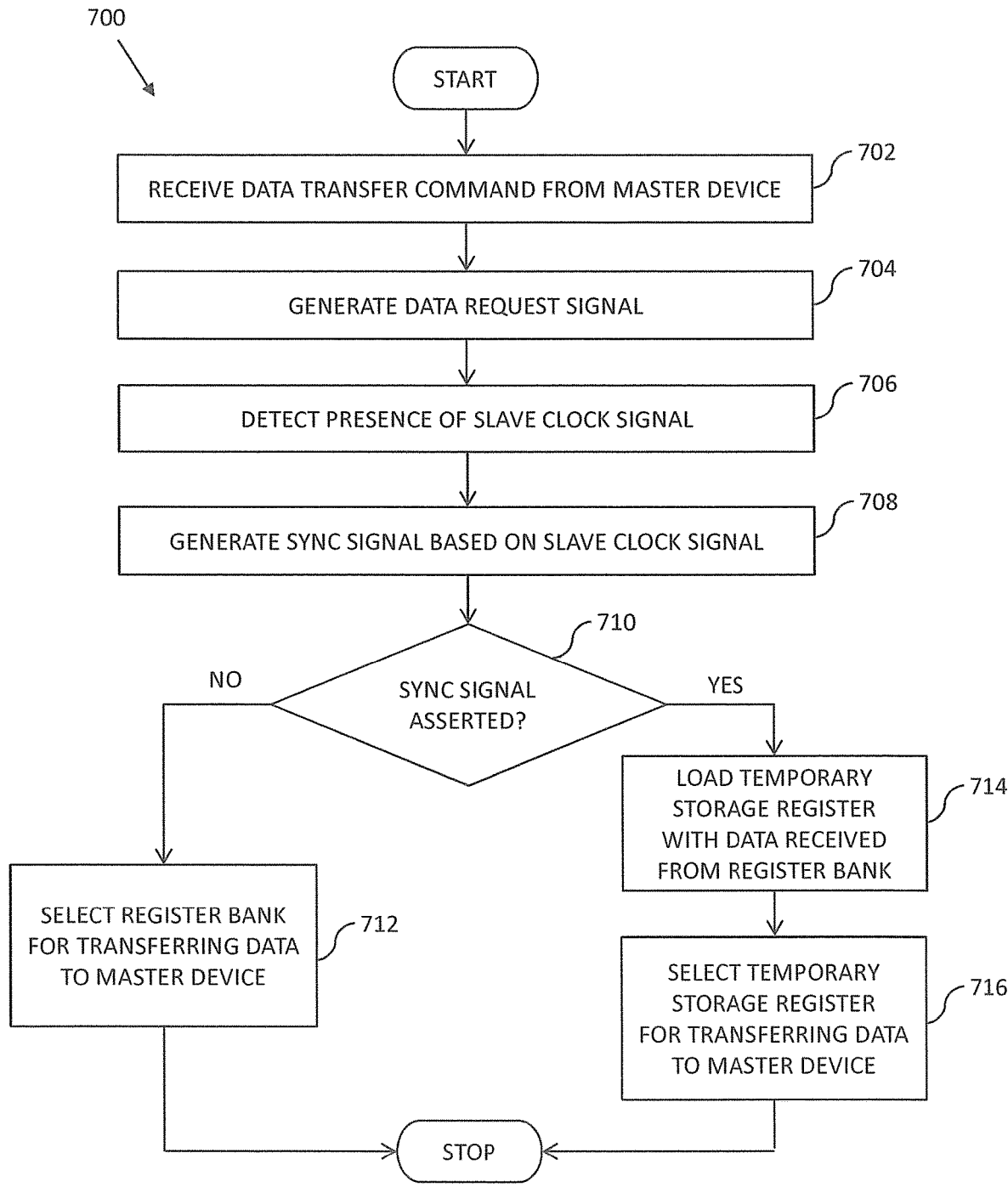
FIG. 7 is a flow chart that illustrates a method for transferring data from a slave device to a master device in accordance with an embodiment of the present invention.

Referring now to FIG. 7, a flow chart 700 illustrating a method for transferring data from the slave 104 to the master 102 in accordance with an embodiment of the present invention is shown.

At step 702, the slave 104 receives the data transfer command for transferring the data to the master 102. At step 704, the slave 104 generates the data request signal D_REQ based on the data transfer command. At step 706, the clock detection circuit 206 detects the presence of the slave clock signal S_CLK based on the data request signal D_REQ.

At step 708, the clock detection circuit 206 generates the sync signal based on the detection of the presence of the slave clock signal S_CLK. The sync signal remains in the inactive state (i.e., not asserted) when the slave clock signal S_CLK is absent and is asserted when the slave clock signal S_CLK is present.

At step 710, the datapath selector 212 determines whether the sync signal is asserted. If at step 710, the datapath selector 212 determines that the sync signal is not asserted, step 712 is performed. At step 712, the datapath selector 212 selects the register bank 208 data for transferring to the master device 102.

If at step 710, the datapath selector 212 determines that the sync signal is asserted, step 714 is performed. At step 714, the temporary storage register 210 is loaded with the data received from the register bank 208. At step 716, the datapath selector 212 selects the data from temporary storage register 210 for transferring to the master device 102.

The slave device 104 includes the clock detection circuit 206, which continuously detects the presence of the slave clock signal S_CLK and generates the sync signal based on the detection. The datapath selector 212 receives the sync signal as an input and selects one of the register bank 208 data and the temporary storage register 210 data for transferring to the master device 102. Thus, the slave device 104 not only overcomes clock domain crossing (CDC) issues caused due to clock domain incompatibilities of the master and slave devices 102 and 104 but also ensures seamless data transfer to the master device 102 irrespective of the presence or absence of the slave clock signal S_CLK. Since the slave device 104 does not rely on first-in-first-out (FIFO) buffers for transferring data to the master device 102, the slave device 104 has a smaller size and less complex circuitry than conventional slave devices that use FIFO buffers.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A circuit for transferring data from a first device to a second device, wherein the first device operates based on a first, non-continuous clock signal and the second device operates based on a second clock signal that is asynchronous with the first clock signal, the circuit comprising:
   a clock detection circuit that (i) receives a data transfer request signal for transferring data from the first device to the second device, and (ii) generates a sync signal that is inactive when the first clock signal is absent and asserted when the first clock signal is present and the data transfer request signal is active;
   a register bank that stores the data;
   a temporary storage register connected to the clock detection circuit for receiving the sync signal and to the register bank for receiving the data therefrom, wherein the temporary storage register receives the data when the sync signal is asserted; and
   a datapath selector connected to the register bank and the temporary storage register, wherein the datapath selector outputs the data from one of the temporary storage register and the register bank based on the sync signal.

2. The circuit of claim 1, further comprising:
   a command decoder that receives a data transfer command and the second clock signal from the second device, wherein the command decoder decodes the data transfer command to generate the data request signal, an end of transmission (EOT) signal, and a load signal; and
   a reset synchronizer connected to the command decoder for receiving the EOT signal, wherein the reset synchronizer also receives the first clock signal and generates, based on the EOT signal and the first clock signal, a first reset signal to reset the clock detection circuit.

3. The circuit of claim 2, wherein the clock detection circuit comprises:
   a synchronizer circuit connected to the command decoder and the reset synchronizer for receiving the data request signal and the first reset signal, respectively, wherein the synchronizer circuit further receives the first clock signal and synchronizes the data request signal with the first clock signal to generate a synchronized request signal; and
   a pulse generator connected to the synchronizer circuit and the reset synchronizer for receiving the synchronized request signal and the first reset signal, respectively, wherein the pulse generator further receives the first clock signal and generates the sync signal.

4. The circuit of claim 3, wherein the synchronizer circuit comprises:
   a first flip-flop connected to the command decoder and the reset synchronizer for receiving the data request signal and the first reset signal, respectively, wherein the first flip-flop further receives the first clock signal and generates an intermediate request signal based on the data request signal and the first clock signal; and
   a second flip-flop connected to the first flip-flop and the reset synchronizer for receiving the intermediate request signal and the first reset signal, respectively, wherein the second flip-flop also receives the first clock signal and generates the synchronized request signal based on the intermediate request signal and the first clock signal.

5. The circuit of claim 3, wherein the pulse generator comprises:
   a first flip-flop connected to the synchronizer circuit and the reset synchronizer for receiving the synchronized request signal and the first reset signal, respectively, wherein the first flip-flop also receives the first clock signal and generates a delayed request signal based on the synchronized request signal and the first clock signal; and a first logic circuit connected to the synchronizer circuit and the first flip-flop for receiving the synchronized request signal and the delayed request signal, respectively, wherein the first logic circuit generates the sync signal based on the synchronized request signal and the delayed request signal.

6. The circuit of claim 2, wherein the datapath selector comprises:

a first flip-flop connected to the command decoder for receiving the data request signal, wherein the first flip-flop generates and provides a register request signal to the register bank based on the data request signal;

a first logic circuit connected to the first flip-flop and the clock detection circuit for receiving the register request signal and the sync signal, respectively, wherein the first logic circuit generates a select signal based on the register request signal and the sync signal; and a multiplexer circuit having first and second data input terminals respectively connected to the register bank and the temporary storage register, and a select terminal connected to the first logic circuit for receiving the select signal, wherein the multiplexer circuit outputs the data stored in one of the temporary storage register and the register bank based on the select signal.

7. The circuit of claim 6, wherein the select signal is in an active state when at least one of the sync signal and the register request signal is in an active state, and wherein the select signal is in an inactive state when the sync signal is in the inactive state and the register request signal is in an inactive state.

8. The circuit of claim 7, wherein the datapath selector selects the register bank when the select signal is in the active state and selects the temporary storage register when the select signal is in the inactive state.

9. The circuit of claim 6, wherein the datapath selector further comprises:

a second logic circuit connected to the clock detection circuit and the reset synchronizer for receiving the sync signal and the first reset signal, respectively, wherein the second logic circuit generates a second reset signal based on the sync signal and the first reset signal for resetting the first flip-flop.

10. The circuit of claim 6, further comprising:

a response generator in communication with the second device, wherein the response generator receives the data from the multiplexer circuit based on the load signal and outputs the data to the second device.

11. The circuit of claim 1, wherein the first device is a slave and the second device is a master.

12. A system-on-chip (SoC), comprising:

a slave device for transferring data to a master device, wherein the slave and master devices operate based on slave and master clock signals, respectively, that are asynchronous to each other, wherein the slave clock signal is a non-continuous clock signal, and wherein the slave device comprises:

a clock detection circuit that receives a data request signal for transferring the data to the master device and generates a sync signal, wherein the sync signal remains in an inactive state when the slave clock signal is absent, and is asserted when the slave clock signal is present and the data request signal is in an active state;

a register bank that stores the data;

a temporary storage register connected to the clock detection circuit for receiving the sync signal and to the register bank for receiving the data therefrom, wherein the temporary storage register receives the data when the sync signal is asserted; and a datapath selector having first and second data input terminals respectively connected to the register bank and the temporary storage register, and a control terminal connected to the clock detection circuit for receiving the sync signal, wherein the datapath selector selects between the first and second data input terminals based on the sync signal, for transferring the data to the master device.

13. The SoC of claim 12, wherein the slave device further comprises:

a command decoder connected to the master device for receiving a data transfer command and the master clock signal, wherein the command decoder decodes the data transfer command to generate the data request signal, an end of transmission (EOT) signal, and a load signal; and a reset synchronizer connected to the command decoder for receiving the EOT signal, wherein the reset synchronizer further receives the slave clock signal and generates, based on the EOT signal and the slave clock signal, a first reset signal to reset the clock detection circuit.

14. The SoC of claim 13, wherein the clock detection circuit comprises:

a synchronizer circuit connected to the command decoder and the reset synchronizer for receiving the data request signal and the first reset signal, respectively, wherein the synchronizer circuit further receives the slave clock signal and synchronizes the data request signal with the slave clock signal to generate a synchronized request signal; and a pulse generator connected to the synchronizer circuit and the reset synchronizer for receiving the synchronized request signal and the first reset signal, respectively, wherein the pulse generator also receives the slave clock signal and generates the sync signal.

15. The SoC of claim 14, wherein the synchronizer circuit comprises:

a first flip-flop connected to the command decoder and the reset synchronizer for receiving the data request signal and the first reset signal, respectively, wherein the first flip-flop further receives the slave clock signal and generates an intermediate request signal based on the data request signal and the slave clock signal; and a second flip-flop connected to the first flip-flop and the reset synchronizer for receiving the intermediate request signal and the first reset signal, respectively, wherein the second flip-flop further receives the slave clock signal and generates the synchronized request signal based on the intermediate request signal and the slave clock signal.

16. The SoC of claim 14, wherein the pulse generator comprises:

a first flip-flop connected to the synchronizer circuit and the reset synchronizer for receiving the synchronized request signal and the first reset signal, respectively, wherein the first flip-flop further receives the slave clock signal and generates a delayed request signal based on the synchronized request signal and the slave clock signal; and a first logic circuit connected to the synchronizer circuit and the first flip-flop for receiving the synchronized request signal and the delayed request signal, respectively, wherein the first logic circuit generates the sync signal based on the synchronized request signal and the delayed request signal.

17. The SoC of claim 13, wherein the datapath selector comprises:
a first flip-flop connected to the command decoder for receiving the data request signal, wherein the first flip-flop generates and provides a register request signal to the register bank based on the data request signal;
a first logic circuit connected to the first flip-flop and the clock detection circuit for receiving the register request signal and the sync signal, respectively,
wherein the first logic circuit generates a select signal based on the register request signal and the sync signal,
wherein the select signal is in an active state when at least one of the sync signal and the register request signal is in an active state and in an inactive state when the sync signal is in an inactive state and the register request signal is in an inactive state, and
wherein the datapath selector selects the register bank when the select signal is in the active state and the temporary storage register when the select signal is in the inactive state;
a multiplexer circuit having the first and second data input terminals respectively connected to the register bank and the temporary storage register, and a select terminal connected to the first logic circuit for receiving the select signal, wherein the multiplexer circuit outputs the data stored in one of the temporary storage register and the register bank based on the select signal; and
a second logic circuit connected to the clock detection circuit and the reset synchronizer for receiving the sync signal and the first reset signal, respectively, wherein the second logic circuit generates a second reset signal based on the sync signal and the first reset signal for resetting the first flip-flop.

18. The SoC of claim 17, wherein the slave device further comprises a response generator that receives the data from the multiplexer circuit based on the load signal and outputs the data to the master device.

* * * * *